(12) United States Patent
Naganuma et al.

(10) Patent No.: US 10,936,127 B2
(45) Date of Patent: Mar. 2, 2021

(54) TOUCH SENSOR AND DISPLAY DEVICE WITH TOUCH SENSOR

(71) Applicant: Japan Display Inc., Minato-ku (JP)

(72) Inventors: Tomohiko Naganuma, Minato-ku (JP); Mitsuhide Miyamoto, Minato-ku (JP); Chunche Ma, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 16/438,935

(22) Filed: Jun. 12, 2019

(65) Prior Publication Data

US 2019/0294276 A1  Sep. 26, 2019

Related U.S. Application Data

(63) Continuation of application No. 16/161,799, filed on Oct. 16, 2018, now Pat. No. 10,359,899, which is a
(Continued)

(30) Foreign Application Priority Data

Sep. 27, 2016 (JP) ................. 2016-188089

(51) Int. Cl.
*G06F 3/044* (2006.01)
*G06F 3/041* (2006.01)
(Continued)

(52) U.S. Cl.
CPC ............ *G06F 3/044* (2013.01); *G06F 3/0412* (2013.01); *G06F 3/0414* (2013.01);
(Continued)

(58) Field of Classification Search
CPC ...... G06F 3/044; G06F 3/0414; G06F 3/0418; G06F 3/0412; G06F 2203/04111;
(Continued)

(56) References Cited

U.S. PATENT DOCUMENTS 9,262,031 B1    2/2016  Moon
2010/0315373 A1  12/2010  Steinhauser et al.
(Continued)

FOREIGN PATENT DOCUMENTS

JP    2011-501307    1/2011
JP    5783346        9/2015
(Continued)

OTHER PUBLICATIONS

Combined Office Action and Search Report dated May 7, 2018 in Taiwanese Patent Application No. 106131340 (with English language translation), 8 pages.
Korean Office Action dated Jul. 20, 2018 in corresponding Korean Application No. 10-2017-0116602, with English Translation, 7 pages.

*Primary Examiner* — Abhishek Sarma
(74) *Attorney, Agent, or Firm* — Oblon, McClelland, Maier & Neustadt, L.L.P.

(57) ABSTRACT

First electrodes are formed on an insulation surface in such a manner that the adjacent first electrodes are connected in a first direction and are separated in a second direction intersecting the first direction. Second electrodes are formed on an insulation surface in such a manner that the adjacent second electrodes are connected in the second direction and are separated in the first direction. Third electrodes are formed in regions in which the third electrodes overlap with the first electrodes and do not overlap with the second electrodes in such a manner that the adjacent third electrodes are connected in the second direction and are separated in the first direction. A flexible insulation layer is formed between the first electrodes and the third electrodes. An area of each of the third electrodes is less than an area of each of the first electrodes.

20 Claims, 15 Drawing Sheets

Related U.S. Application Data continuation of application No. 15/704,535, filed on Sep. 14, 2017, now Pat. No. 10,139,979.

(51) Int. Cl.
*H01L 27/32* (2006.01)
*H01L 51/52* (2006.01)
*H01L 51/00* (2006.01)

(52) U.S. Cl.
CPC .......... *G06F 3/0418* (2013.01); *H01L 27/323* (2013.01); *H01L 51/5253* (2013.01); *G06F 2203/04111* (2013.01); *H01L 51/0097* (2013.01); *H01L 2251/5338* (2013.01)

(58) Field of Classification Search
CPC . G06F 3/0416; H01L 51/5253; H01L 27/323; H01L 2251/5338; H01L 51/0097; H01L 51/5237
See application file for complete search history.

(56) References Cited

U.S. PATENT DOCUMENTS

| | | |
|---|---|---|
| 2013/0082970 A1 | 4/2013 | Frey |
| 2015/0153767 A1* | 6/2015 | Nakayama .............. G06F 3/044 345/174 |
| 2015/0378493 A1 | 12/2015 | Kano et al. |
| 2016/0170524 A1* | 6/2016 | Kim ........................ G06F 3/044 345/174 |
| 2017/0031479 A1 | 2/2017 | Kim |
| 2017/0357346 A1 | 12/2017 | Wang |
| 2017/0371470 A1* | 12/2017 | Nathan ................. G06F 3/0414 |

FOREIGN PATENT DOCUMENTS

| | | |
|---|---|---|
| KR | 10-2015-0110156 | 10/2015 |
| TW | 201604726 A | 2/2016 |
| WO | WO 2014/045604 A1 | 3/2014 |

* cited by examiner

TOUCH SENSOR AND DISPLAY DEVICE WITH TOUCH SENSOR

CROSS-REFERENCE TO RELATED APPLICATION

The present application is a Continuation of U.S. application Ser. No. 16/161,799 filed Oct. 16, 2018, which is a Continuation of U.S. application Ser. No. 15/704,535 filed Sep. 14, 2017, and claims priority from Japanese application JP2016-188089 filed on Sep. 27, 2016, the content of each of which is hereby incorporated by reference into this application.

BACKGROUND OF THE INVENTION

1. Field of the Invention

The present invention relates to a touch sensor and a display device with the touch sensor.

2. Description of the Related Art

Electrostatic capacitance schemes are widely used for touch panels of mobile displays of smartphones or the like. In the related art, touch panels are formed separately from displays in many cases. However, in recent years, touch panels tend to be contained because of thinness, low cost, and superiority of optical characteristics.

As a sensing scheme, there is known a display on which a pressure sensor which detects a position and also detects a pressing pressure when pressing is performed with a finger mounted (JP2011-501307A). Since the pressure sensor is not transparent, the pressure sensor is located on the rear of the display or a peripheral region (casing) of a display region separately from a touch position detection sensor so that light emission is not hindered.

Japanese Patent No. 578346 discloses a structure in which position detection electrodes and pressing pressure detection electrodes are disposed to overlap each other. In this structure, since an electric field is shielded by the pressing pressure detection electrode at the time of detecting a position in an electrostatic capacitance scheme, there is a concern of a sensing operation of a touch position being hindered.

SUMMARY OF THE INVENTION

An object of the invention is to detect a pressing pressure without hindering sensing of a touch position.

According to an aspect of the invention, there is provided a touch sensor including: a plurality of first electrodes that are formed on an insulation surface in such a manner that the adjacent first electrodes are disposed to be connected in a first direction and are disposed to be separated in a second direction intersecting the first direction; a plurality of second electrodes that are formed on an insulation surface in such a manner that the adjacent the second electrodes are disposed to be connected in the second direction and are disposed to be separated in the first direction; a plurality of third electrodes that are formed in regions in which the third electrodes overlap the plurality of first electrodes and do not overlap the plurality of second electrodes in such a manner that the adjacent third electrodes are disposed to be connected in the second direction and are disposed to be separated in the first direction; and a flexible insulation layer that is formed between the plurality of first electrodes and the plurality of third electrodes. An area of each of the plurality of third electrodes is less than an area of each of the plurality of first electrodes.

According to the aspect of the invention, since the area of the third electrode is less than the area of the first electrode, an electric field generated between the first and second electrodes is not completely shielded by the third electrode. Accordingly, it is possible to sense a touch position using the first and second electrodes and to detect a pressing pressure using the first and third electrodes.

According to another aspect of the invention, there is provided a display device with a touch sensor. The display device includes the touch sensor; a substrate that has a display region in which a plurality of pixels respectively including light-emitting elements are arrayed in a matrix form; and a sealing layer that covers the display region and further includes an inorganic insulation layer of at least one layer and an organic insulation layer of at least one layer. The touch sensor is above the sealing layer.

DETAILED DESCRIPTION OF THE INVENTION

Figure 1:
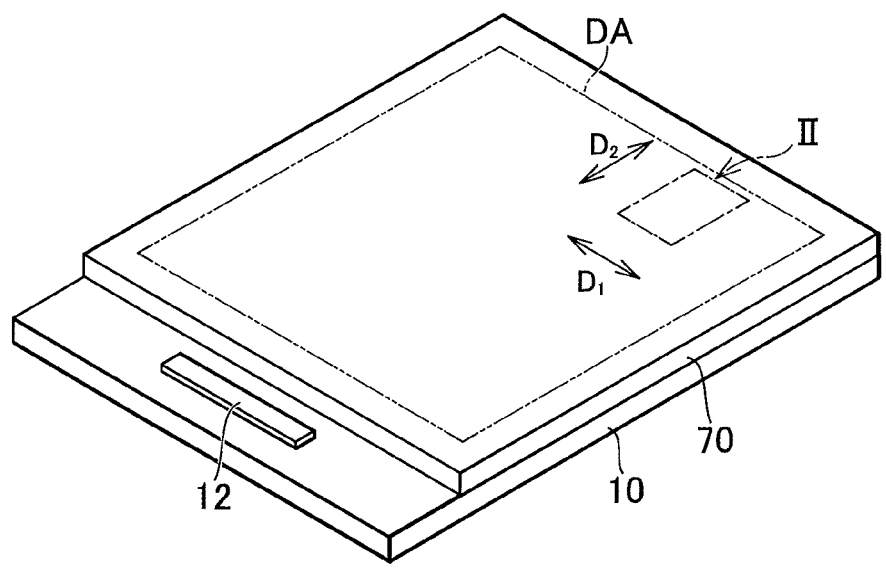
FIG. 1 is a perspective view illustrating a display device according to an embodiment of the invention.

Hereinafter, embodiments of the invention will be described with reference to the drawings. Here, the invention can be embodied according to various aspects within the scope of the invention without departing from the gist of the invention and is not construed as being limited to content described in the embodiments exemplified below.

The drawings are further schematically illustrated in widths, thickness, shapes, and the like of units than actual forms to further clarify description in some cases, but are merely examples and do not limit interpretation of the invention. In the present specification and the drawings, the same reference numerals are given to elements having the same functions described in the previously described drawings and the repeated description will be omitted.

Further, in the detailed description of the invention, "above" and "below" in definition of positional relations of certain constituents and other constituents includes not only a case in which a constituent is located immediately above or immediately below a certain constituent but also a case in which another constituent is interposed between constituents unless otherwise mentioned.

FIG. 1 is a perspective view illustrating a display device according to an embodiment of the invention. An organic electroluminescence display device will be exemplified as the display device. The display device is configured to display a full-color image by combining a plurality of pixels (subpixels) of, for example, red, green, and blue and forming pixels of full color. The display device includes a first substrate 10. The first substrate 10 includes a display region DA in which a plurality of pixels are arrayed in a matrix form. An integrated circuit chip 12 driving elements to display an image is mounted on the first substrate 10 and a flexible printed substrate (not illustrated) may be connected to electrically connect the integrated circuit chip 12 to the outside.

Figure 2:
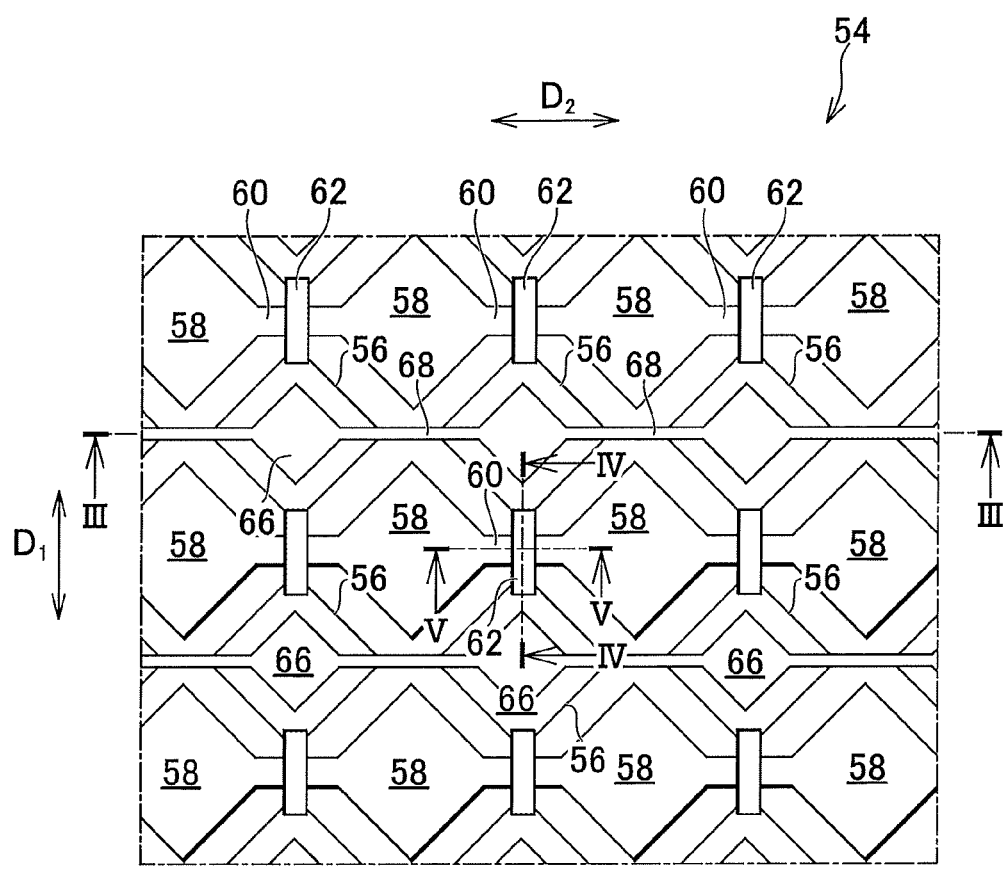
FIG. 2 is an enlarged view illustrating a portion indicated by II in FIG. 1.
Figure 3:
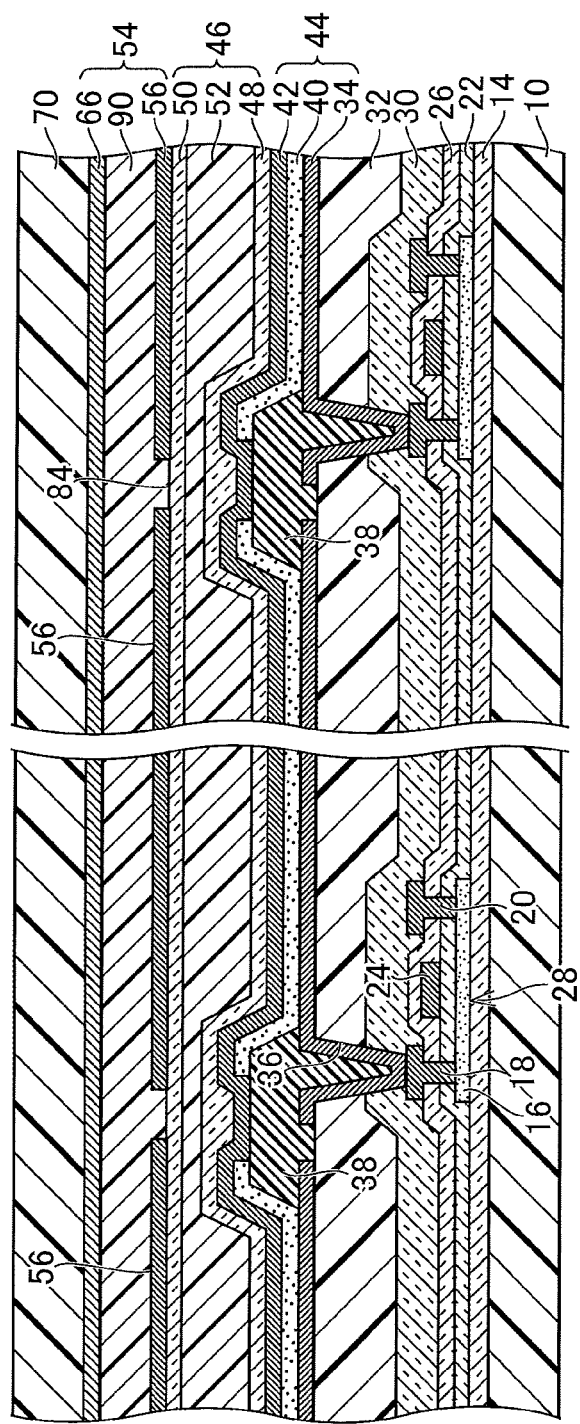
FIG. 3 is an enlarged view illustrating a partially omitted cross-section taken along the line III-III of the display device illustrated in FIG. 2.

FIG. 2 is an enlarged view illustrating a portion indicated by II in FIG. 1. FIG. 3 is an enlarged view illustrating a partially omitted cross-section taken along the line III-III of the display device illustrated in FIG. 2. The first substrate 10 is formed of a resin or glass or may be a film that has flexibility, such as polyimide or polyethylene terephthalate. In the first substrate 10, an undercoat layer 14 serving as a barrier against impurities contained in the first substrate 10 is formed. The undercoat layer 14 is formed of a silicon oxide film or a silicon nitride film or may have a stacked structure of a silicon oxide film and the silicon nitride film. A semiconductor layer 16 is formed above the undercoat layer 14. A source electrode 18 and a drain electrode 20 are electrically connected to the semiconductor layer 16 and a gate insulation film 22 is formed to cover the semiconductor layer 16. A gate electrode 24 is formed above the gate insulation film 22 and an inter-layer insulation film 26 is formed to cover the gate electrode 24. The source electrode 18 and the drain electrode 20 penetrate through the gate insulation film 22 and the inter-layer insulation film 26. A thin film transistor 28 is configured to include the semiconductor layer 16, the source electrode 18, the drain electrode 20, and the gate electrode 24. A passivation film 30 is formed to cover the thin film transistor 28.

A planarized layer 32 is formed above the passivation film 30. Above the planarized film 32, a plurality of pixel electrodes 34 (for example, an anode) are formed to correspond to the plurality of unit pixels (subpixels), respectively. The planarized layer 32 is formed so that surfaces on which at least the pixel electrodes 34 are formed are planarized. As the planarized layer 32, an organic material such as a photosensitive acrylic resin is used in many cases. The pixel electrode 34 is electrically connected to one of the source electrode 18 and the drain electrode 20 above the semiconductor layer 16 by a contact hole 36 penetrating through the planarized layer 32 and the passivation film 30.

An insulation layer 38 is formed above the planarized layer 32 and the pixel electrode 34. The insulation layer 38 is straddled on a peripheral portion of the pixel electrode 34 and is formed to open a part (for example, a middle portion) of the pixel electrode 34. A bank surrounding a part of the pixel electrode 34 is formed by the insulation layer 38.

A light-emitting layer 40 is formed above the pixel electrode 34. The light-emitting layer 40 is formed independently (separated) for each pixel electrode 34 and is also straddled on the insulation layer 38. In this case, the light-emitting layer 40 emits blue, red, or green light to correspond to each pixel. The color corresponding to each pixel is not limited thereto. For example, yellow or white may be added. The light-emitting layer 40 is formed by, for example, evaporation. Alternatively, the light-emitting layer 40 may be formed across the plurality of pixels on the entire surface covering the display region DA (see FIG. 1). That is, the light-emitting layer 40 is continuously formed above the insulation layer 38. In this case, the light-emitting layer 40 is formed by coating in accordance with solvent dispersion. In a case in which the light-emitting layer 40 is formed across the plurality of pixels, the light-emitting layer 40 has a configuration in which white is emitted in all of the subpixels and a portion with a desired color wavelength is extracted through a color filter (not illustrated).

A counter electrode 42 (a common electrode or an anode) is formed above the light-emitting layer 40. The counter electrode 42 is straddled on the insulation layer 38 serving as a bank. A light-emitting element 44 includes the light-emitting layer 40, and the pixel electrode 34 and the counter electrode 42 interposing the light-emitting layer 40. Each of the plurality of pixels includes the light-emitting element 44. The light-emitting layer 40 is interposed between the pixel electrode 34 and the counter electrode 42 and emits light in such a manner that its luminance is controlled by a current flowing between the pixel electrode 34 and the counter electrode 42. At least one layer of a hole transport layer and a hole injection layer (neither of which is illustrated) may be formed between the light-emitting layer 40 and the pixel electrode 34. At least one layer of an electron transport layer and an electron injection layer (neither of which is illustrated) may be formed between the light-emitting layer 40 and the counter electrode 42.

The light-emitting element 44 is covered with a sealing layer 46 stacked on the counter electrode 42 to be sealed, and thus is blocked from water. The sealing layer 46 may have a stacked structure in which an inorganic insulation layer of at least one layer formed of SiN is further included. For example, as illustrated in FIG. 3, the sealing layer 46 may have a structure in which an organic insulation layer 52 of at least one layer formed of a resin or the like is interposed between a pair of inorganic insulation layers 48 and 50. The sealing layer 46 covers the display region DA (see FIG. 1).

The display device according to the embodiment includes a touch sensor 54 above the sealing layer 46. The touch sensor 54 includes a plurality of first electrodes 56. The plurality of first electrodes 56 are formed above an insulation surface 84 of the sealing layer 46. In the plurality of first electrodes 56, the first electrodes 56 adjacent in the first direction D1 are disposed to be connected (in which details will be described below) and the first electrodes 56 adjacent in the second direction D2 intersecting (for example, orthogonal to) the first direction D1 are disposed to be separated.

As illustrated in FIG. 3, a region (space) between the adjacent first electrodes 56 is located on the upper side of the insulation layer 38 (the bank). Each first electrode 56 has a size covering a plurality of pixels. In a case in which a distance between the first electrode 56 and the light-emitting element 44 is close, optical characteristics are improved by causing the shape of the first electrode 56 to correspond to the shape of the pixel. When the first electrode 56 and the light-emitting element 44 are sufficiently separated from each other, it is not necessary to form the first electrode 56 according to the shape of the pixel. The content described in this paragraph also corresponds to the second electrode 58 to be described below.

The touch sensor 54 includes the plurality of second electrodes 58, as illustrated in FIG. 2. The plurality of second electrodes 58 are formed on the insulation surface 84 of the sealing layer 46 (see FIG. 3). In the plurality of second electrodes 58, the second electrodes 58 adjacent in the second direction D2 are disposed to be connected and the second electrodes 58 adjacent in the first direction D1 are disposed to be separated. The second electrodes 58 adjacent in the second direction D2 are connected by a second connection portion 60. The second electrodes 58 and the second connection portion 60 are disposed in the same layer. The plurality of first electrodes 56 and the plurality of second electrodes 58 are disposed in the same layer without overlapping each other and are spaced to be insulated from each other.

Figure 4:
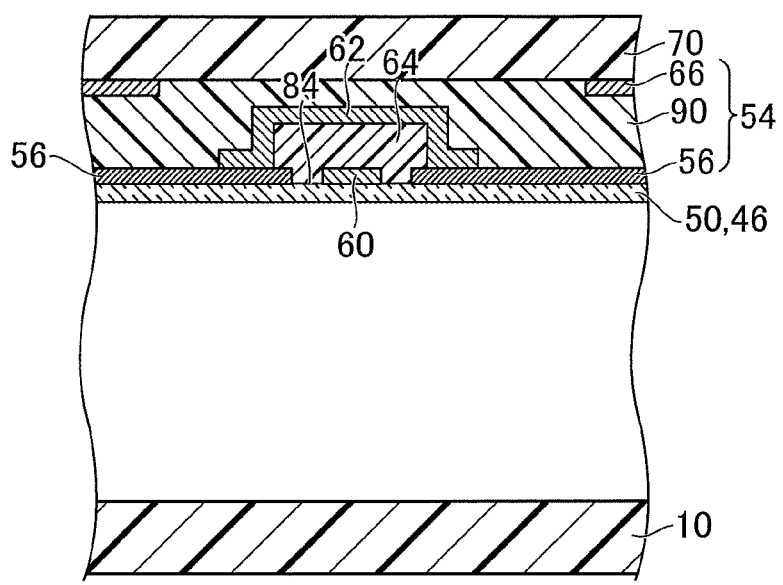
FIG. 4 is an enlarged view illustrating a cross-section taken along the line IV-IV of the display device illustrated in FIG. 2.
Figure 5:
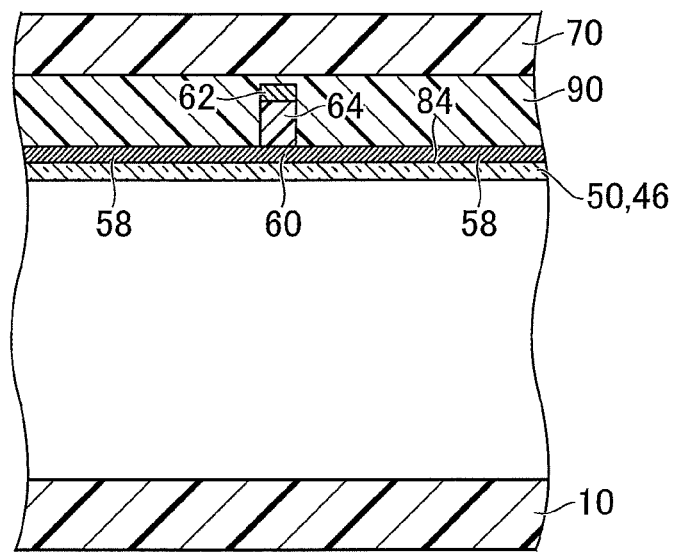
FIG. 5 is an enlarged view illustrating a cross-section taken along the line V-V of the display device illustrated in FIG. 2.

FIGS. 4 and 5 are enlarged views illustrating cross-sections taken along the lines IV-IV and V-V of the display device illustrated in FIG. 2, respectively. The adjacent first electrodes 56 are connected by a first connection portion 62. The first connection portion 62 overlap the second connection portion 60, but are configured not to be conductive via an insulation film 64. In FIGS. 4 and 5, the insulation film 64 is disposed only immediately below the first connection portion 62 and is separated into a plurality of portions. The insulation film 64 is formed to entirely cover the first electrode 56 and a contact hole may be opened only in a connection portion of the first connection portion 62 and the first electrode 56.

The touch sensor 54 includes a plurality of third electrodes 66, as illustrated in FIG. 2. The plurality of third electrodes 66 overlap the plurality of first electrodes 56. A flexible insulation layer 90 is formed between the plurality of first electrodes 56 and the plurality of third electrodes 66. The flexible insulation layer 90 is continuously formed from a plurality of first region overlapping the plurality of first electrodes 56 to a plurality of second regions overlapping the plurality of second electrodes 58. The flexible insulation layer 90 can easily be formed such as aqueous dispersion polyurethane and is preferably formed of a transparent soft material.

As illustrated in FIG. 2, the plurality of third electrodes 66 overlap none of the plurality of second electrodes 58. The plurality of third electrodes 66 are disposed so that the adjacent third electrodes 66 are separated in the first direction D1. The plurality of third electrodes 66 are disposed so that the adjacent third electrodes 66 are connected in the second direction D2. The third electrodes 66 adjacent in the second direction D2 are connected by a third connection portion 68. The third electrodes 66 and the third connection portion 68 are disposed in the same layer. The first electrode 56, the second electrode 58, and the third electrode 66 are formed of a material which can be transparently formed at a low temperature, such as indium tin oxide (ITO) or indium zinc oxide (IZO).

As illustrated in FIG. 3, a second substrate 70 is adhered to the plurality of third electrodes 66 in the uppermost layer of the touch sensor 54. The second substrate 70 is formed of a resin or glass and may be a film that has flexibility as in the first substrate 10. An adhesive (not illustrated) is used when the second substrate 70 is adhered. The display device can contain a touch panel, and thus configured to detect a touch by approach to a conductor such as a finger. In the embodiment, the principle of a mutual capacitance scheme is adopted. In the mutual capacitance scheme, presence or absence of a touch and coordinates of the touch are determined by detecting a change in electrostatic capacitance between the plurality of first electrodes 56 and the plurality of second electrodes 58.

Figure 6:
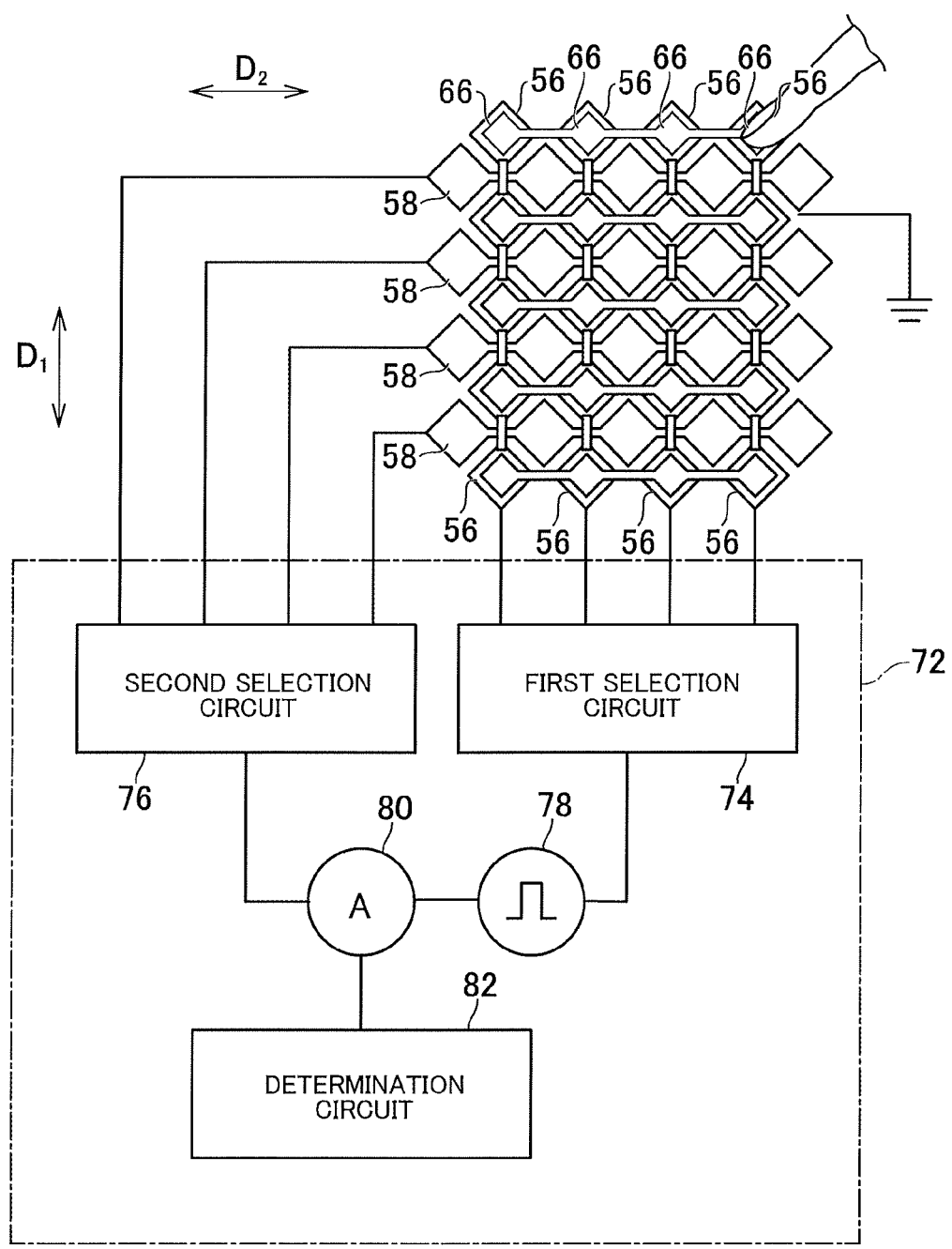
FIG. 6 is a diagram illustrating a circuit for touch sensing in the display device according to the embodiment.

FIG. 6 is a diagram illustrating a circuit for touch sensing in the display device according to the embodiment. The display device includes a sensing circuit 72. For example, the sensing circuit 72 is contained in the integrated circuit chip 12 illustrated in FIG. 1. The sensing circuit 72 includes a first selection circuit 74. The first selection circuit 74 selects one group of the first electrodes 56 connected in the first direction D1. The sensing circuit 72 includes a second selection circuit 76. The second selection circuit 76 selects one group of the second electrodes 58 connected in the second direction D2. The sensing circuit 72 includes a pulse generator 78. A pulse voltage output from the pulse generator 78 is applied to one of the selected one group of the first electrodes 56 and the selected one group of the second electrodes 58 (in this example, the former). Other electrodes (in this example, the second electrodes 58) different from to the electrodes to which the pulse voltage is applied are connected to an ammeter 80. The ammeter 80 measures a first physical amount (current value) corresponding to first electrostatic capacitance. The first physical amount corresponds to electrostatic capacitance between one group of the first electrodes 56 and one group of the second electrodes 58.

The electrostatic capacitance is formed between one group of the first electrodes 56 connected in the first direction D1 and one group of the second electrodes 58 connected in the second direction D2. For example, first electrostatic capacitance is formed between the selected one group of the first electrodes 56 and the selected one group of the second electrodes 58. When a pulse is input to one of the first electrode 56 and the second electrode 58, a potential variation is delivered to the other of the first electrode 56 and the second electrode 58 by coupling based on the first electrostatic capacitance. When there is a touch of a conductor such as a finger, an electric field is also generated between the touched conductor and the first electrode 56 or between the touched conductor and the second electrode 58 in addition to an electric field between the first electrode 56 and the second electrode 58. These electric fields inhibit a part of the coupling between the first electrode 56 and the second electrode 58. Accordingly, at a touched location, the delivery of the potential variation between the first electrode 56 and the second electrode 58 by the coupling decreases. By detecting this change amount (see the next paragraph), presence or absence of the touch and the coordinates of the touch are detected.

Figure 7:
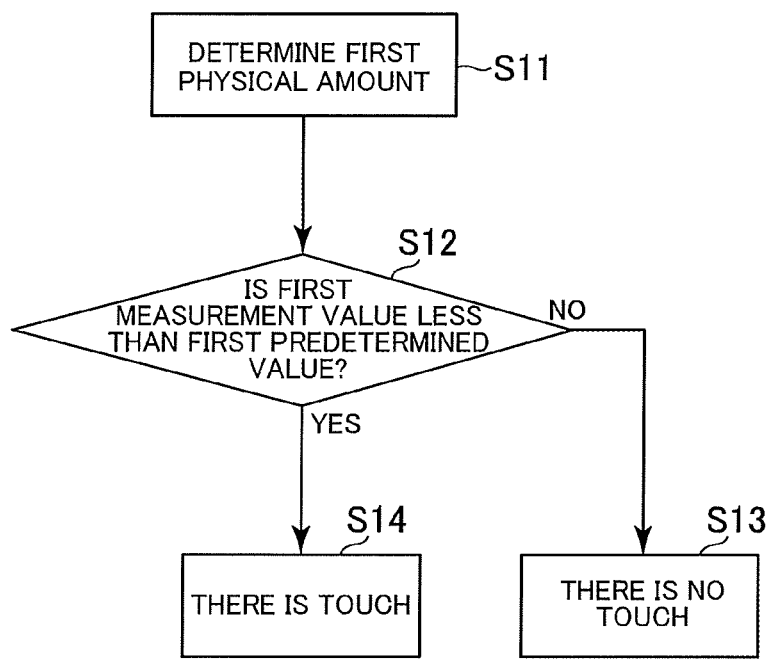
FIG. 7 is a diagram illustrating a touch sensing flow of the display device according to the embodiment.

FIG. 7 is a diagram illustrating a touch sensing flow of the display device according to the embodiment. When the first physical amount (current value) is measured by the ammeter 80 illustrated in FIG. 6 (S11), a first measurement value obtained through the measurement is input to a determination circuit 82. The determination circuit 82 determines whether the first measurement value deviates from a first range. The first range is a range in which an error is considered in a designed value when there is no touch of the conductor such as a finger. When the first measurement value is within the first range, there is no touch. When the first measurement value deviates from the first range, it is detected that a meaningful change in the first electrostatic capacitance is made due to approach of the conductor such as a finger (that is, there is a touch).

In the embodiment, the mutual capacitance scheme in which the first measurement value is lowered when there is a touch is adopted. Therefore, the determination circuit 82 determines whether the first measurement value is less than a first predetermined value by determining whether the first measurement value deviates from the first range (S12). When the result of the determination is NO, it is detected that there is no touch (S13). When the result of the determination is YES, it is detected that there is the touch (S14).

Figure 8:
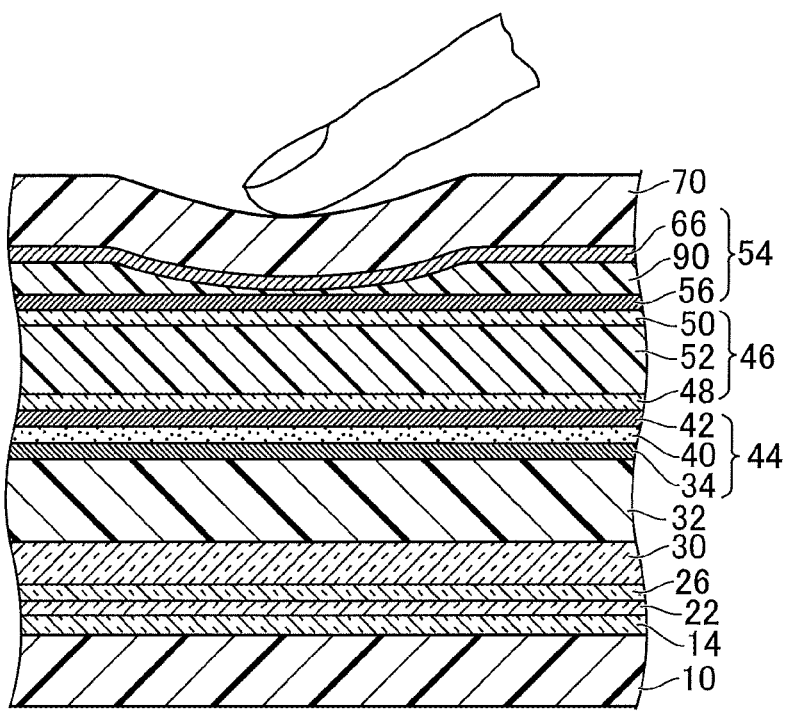
FIG. 8 is a diagram illustrating a state in which a screen is pressed with a finger.

FIG. 8 is a diagram illustrating a state in which a screen is pressed with a finger. The flexible insulation layer 90 is pressed via the second substrate 70 and the third electrode 66 by a pressing pressure. Thus, a gap between the first electrode 56 and the third electrode 66 is narrowed. As a result, the electrostatic capacitance between the first electrode 56 and the third electrode 66 increases. In the embodiment, the pressing pressure of a touch is determined by detecting a change in the electrostatic capacitance between the plurality of first electrodes 56 and the plurality of third electrodes 66 caused by a displacement of the flexible insulation layer 90 in its thickness direction.

Figure 9:
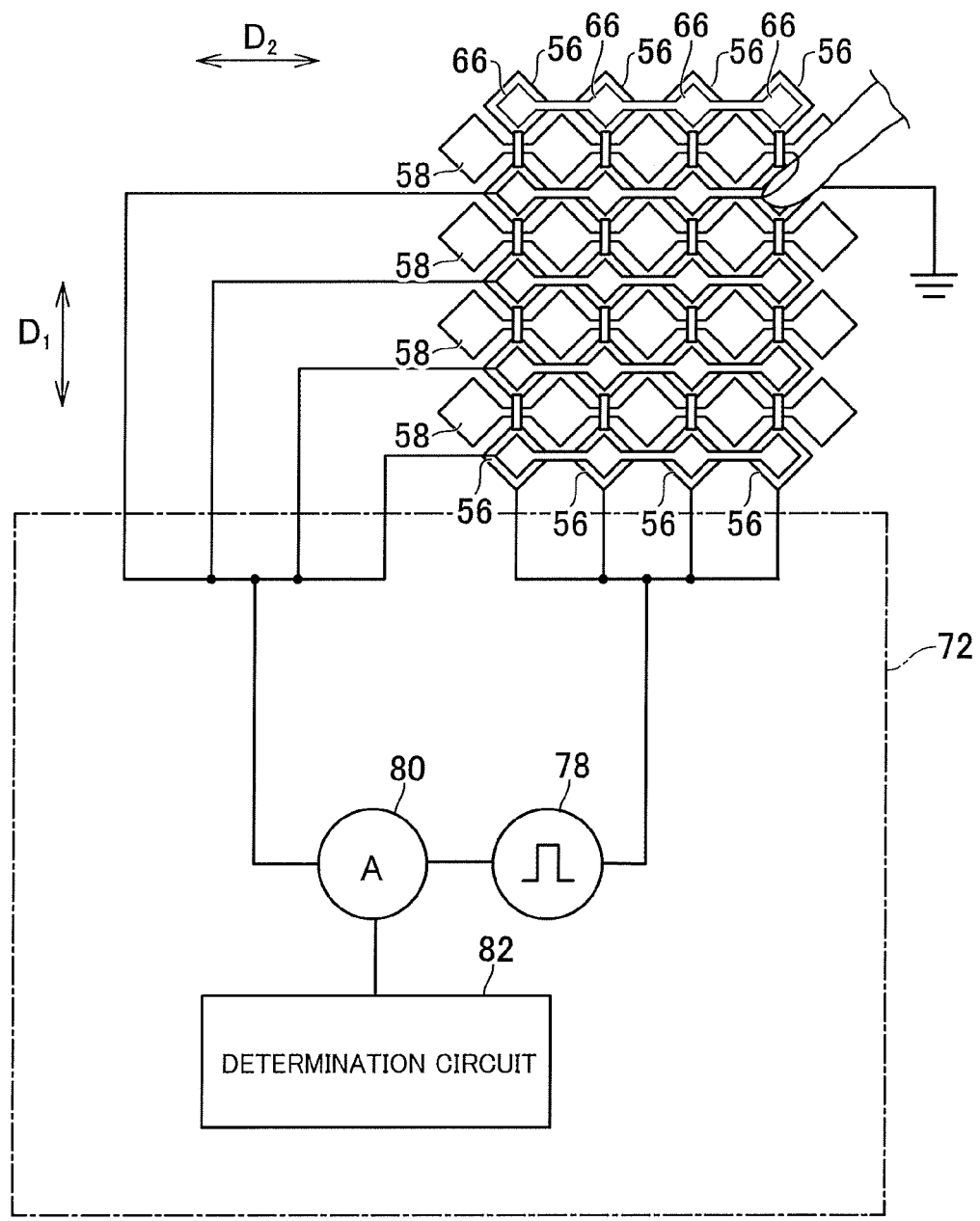
FIG. 9 is a diagram illustrating a circuit for pressing pressure sensing in the display device according to the embodiment.

FIG. 9 is a diagram illustrating a circuit for pressing pressure sensing in the display device according to the embodiment. The sensing circuit 72 measures a second physical amount corresponding to second electrostatic capacitance between each of the plurality of first electrodes 56 and each of the plurality of third electrodes 66. When only presence or absence of a pressing pressure is detected (a position of the pressing pressure not is detected), the second physical amount corresponding to a sum of the plurality of second electrostatic capacitances may be measured. For example, the plurality of first electrodes 56 are connected to each other, the plurality of third electrodes 66 are connected to each other, the second physical amount (current value) is measured by the ammeter 80 in accordance with a pulse voltage applied from the pulse generator 78. The plurality of first electrodes 56 may be connected to each other by the first selection circuit 74 (see FIG. 6) and the plurality of third electrodes 66 may be connected to each other by the second selection circuit 76 (see FIG. 6). When there is a pressing pressure by a finger or the like, second electrostatic capacitance increases. Accordingly, current consumption increases when the pulse generator 78 inputs a pulse to the plurality of first electrodes 56 or the plurality of third electrodes 66 to perform charging or discharging.

Figure 10:
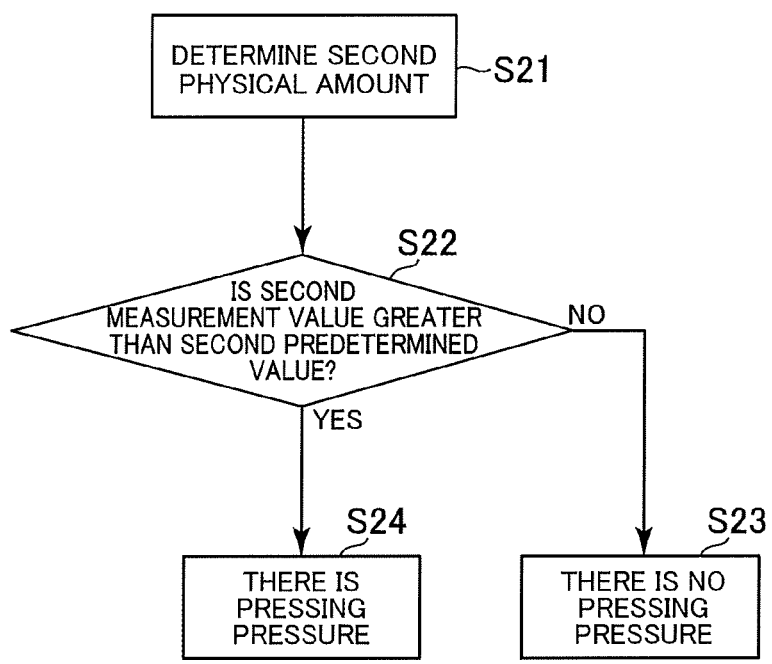
FIG. 10 is a diagram illustrating a pressing pressure sensing flow of the display device according to the embodiment.

FIG. 10 is a diagram illustrating a pressing pressure sensing flow of the display device according to the embodiment. When the second physical amount (current value) is measured by the ammeter 80 (S21), a second measurement value obtained through the measurement is input to the determination circuit 82 (see FIG. 9). The determination circuit 82 determines whether the second measurement value deviates from a second range. The second range is a range in which an error is considered in a designed value when there is no pressing pressure by a finger or the like. When the second measurement value is within the second range, there is no pressing pressure. When the second measurement value deviates from the second range, it is detected that a meaningful change in the second electrostatic capacitance is made due to compression of the flexible insulation layer 90 by a pressing pressure force (that is, there is a pressing pressure).

When the flexible insulation layer 90 is compressed, the gap between the first electrode 56 and the third electrode 66 is narrowed and the second measurement value increases. Therefore, the determination circuit 82 determines whether the second measurement value is greater than a second predetermined value by determining whether the second measurement value deviates from the second range (S22). When the result of the determination is NO, it is detected that there is no pressing pressure (523). When the result of the determination is YES, it is detected that there is the pressing pressure (S24).

According to the embodiment, as illustrated in FIG. 2, the area of each of the plurality of third electrodes 66 is less than the area of each of the plurality of first electrodes 56. Accordingly, an electric field generated between the first electrode 56 and the second electrode 58 at the time of touch sensing is not completely shielded by the third electrode 66. Therefore, the touch sensing can be performed using the first electrode 56 and the second electrode 58. In addition, the pressing pressure sensing can be performed using the first electrode 56 and the third electrode 66.

Figure 11:
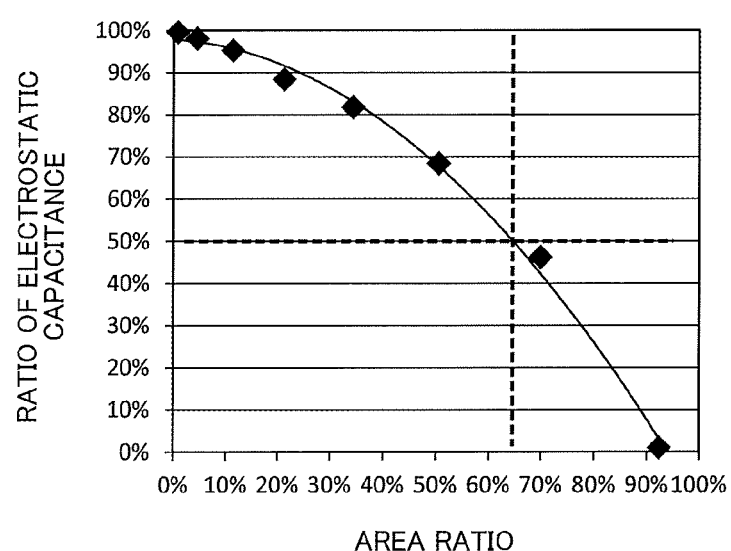
FIG. 11 is a diagram illustrating a result of a simulation performed to inspect an influence of shielding by a third electrode.

FIG. 11 is a graph illustrating a result of a simulation performed to inspect an influence of shielding by the third electrode 66. Specifically, when a pulse voltage is applied to the first electrode 56 overlapped below the third electrode 66, it was calculated how the electrostatic capacitance between the first electrode 56 and a finger (not illustrated) changes according to an area ratio of the third electrode 66 to the first electrode 56. In FIG. 11, the horizontal axis represents an area ratio of the third electrode 66 to the first electrode 56 and the vertical axis represents a ratio of the electrostatic capacitance. When the area ratio is 0%, there is no third electrode 66. At that time, the electrostatic capacitance is assumed to be 100%. In other words, an inhibition ratio of the electrostatic capacitance between the first electrode 56 and the finger is assumed to be 0%.

To cause a position sensing function by the first electrode 56 and the second electrode 58 and a pressure-sensitive sensing function by the first electrode 56 and the third electrode 66 to be compatible, it is necessary to ensure electrostatic capacitance of at least 50% in this simulation. When the area ratio is 65%, the electrostatic capacitance is 50%. In other words, when the area ratio of the third electrode to the first electrode 56 is 65%, 50% of the electrostatic capacitance between the first electrode 56 and the finger is inhibited by the third electrode 66. Accordingly, the area of each of the plurality of third electrodes 66 is preferably equal to or less than 65% of the area of each of the plurality of first electrodes 56. Further, 25% at which the electrostatic capacitance of 90% is obtained may be set as a lower limit of the area ratio.

Figure 12:
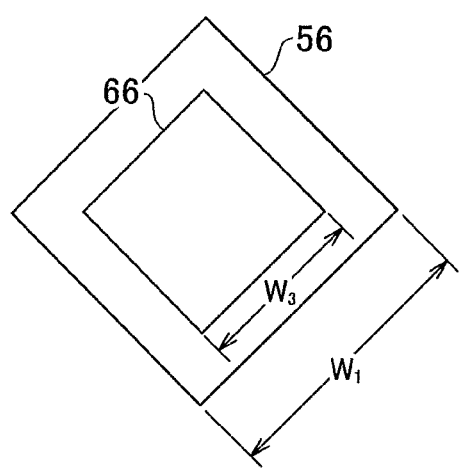
FIG. 12 is a diagram illustrating an area ratio of a first electrode to the third electrode.

FIG. 12 is a diagram illustrating an area ratio of the first electrode 56 to the third electrode 66. In this example, the first electrode 56 has a diamond pattern. For example, when a width W1 of a side of the first electrode 56 is 4 mm, the area is 16 mm$^2$. The area of the third electrode 66 may be equal to or less than 10.4 mm$^2$ which is 65% of the area or a width W3 of a side of the third electrode 66 may be equal to or less than 3.2 mm.

Figure 13:
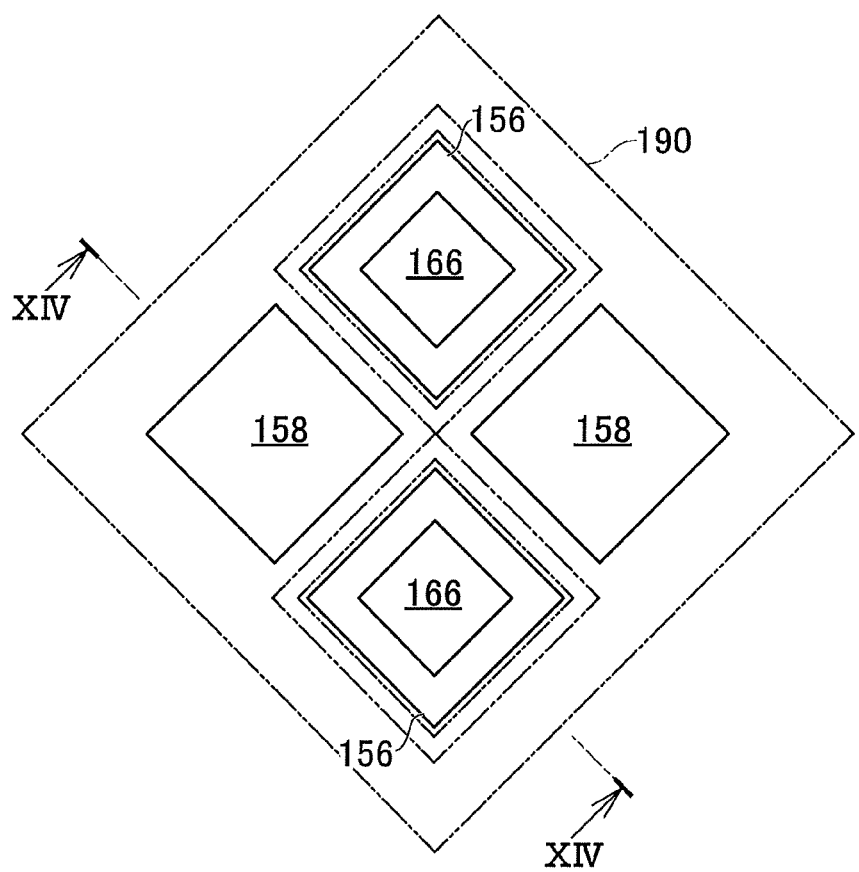
FIG. 13 is a diagram according to a first modification example of the embodiment of the invention.
Figure 14:
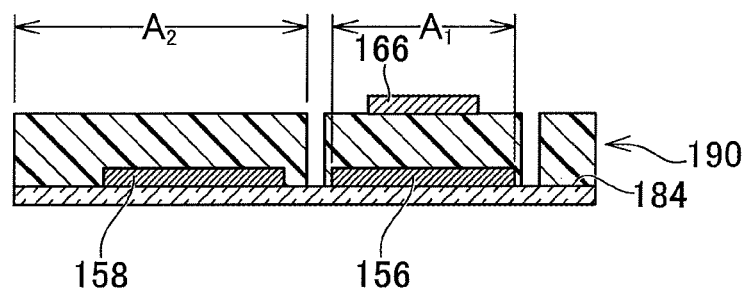
FIG. 14 is a sectional view the structure taken along the line XIV-XIV illustrated in FIG. 13.

FIG. 13 is a diagram according to a first modification example of the embodiment of the invention. FIG. 14 is a sectional view the structure taken along the line XIV-XIV illustrated in FIG. 13. In this example, first electrodes 156 and second electrodes 158 are arranged on an insulation surface 184. A flexible insulation layer 190 is provided to be separated from a plurality of first regions A1 overlapping the plurality of first electrodes 156 and a second region A2 different from the plurality of first regions A1. Third electrodes 166 are disposed on the upper side of the first electrodes 156 and above the flexible insulation layer 190. In this example, since the flexible insulation layer 190 is separated from the first regions A1 and the second region A2, the flexible insulation layer 190 is easily deformed. Since the flexible insulation layer 190 is considerably changed, a change in electrostatic capacitance increases and sensitivity of a pressing pressure sensing is raised.

Figure 15:
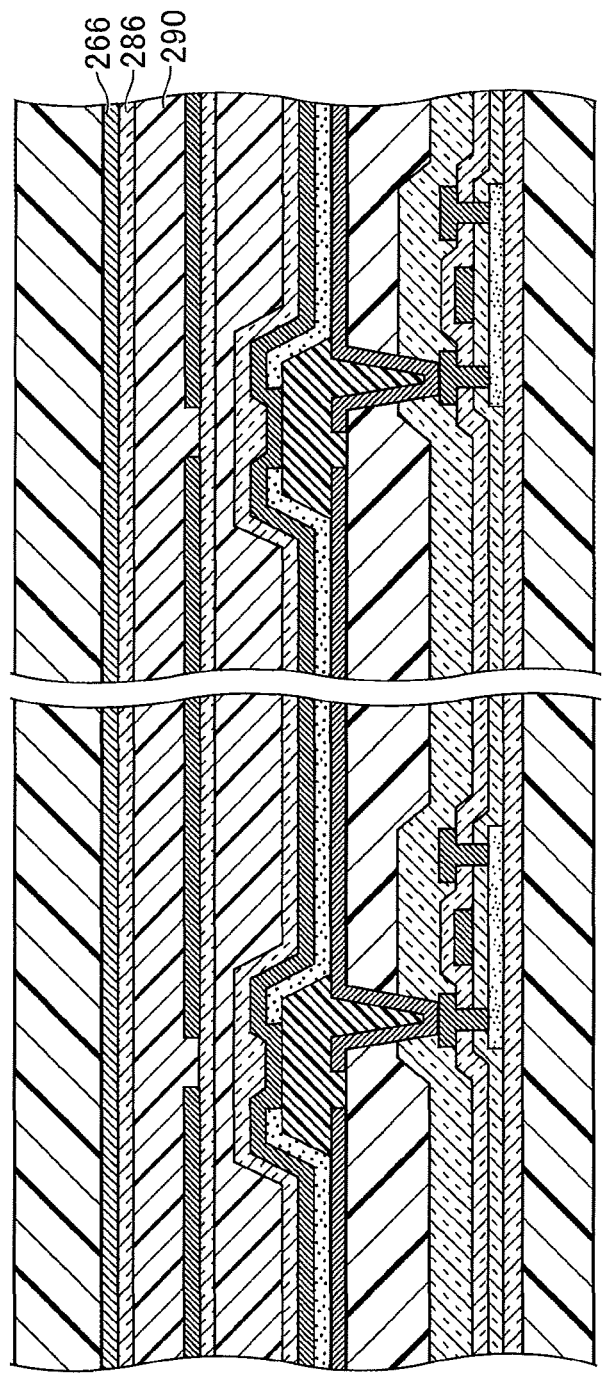
FIG. 15 is a diagram according to a second modification example of the embodiment of the invention.

FIG. 15 is a diagram according to a second modification example of the embodiment of the invention. In this example, a buffer layer 286 is interposed between a third electrode 266 and a flexible insulation layer 290. The buffer layer 286 is formed of a material that has tolerance to chemicals used for photolithography or etching. For example, a silicon nitride film formed by a chemical vapor deposition (CVD) process can be exemplified.

Since there is the buffer layer 286, it is possible to protect the flexible insulation layer 290 against chemicals when the third electrodes 266 are formed above the buffer layer 286 by photolithography or etching. A contact hole (not illustrated) for electric connection of the third electrodes 266 is formed by etching the flexible insulation layer 290 along with the buffer layer 286. In a case in which chemical resistance of the flexible insulation layer 290 is excellent as in a fluorine-based resin or when a process of forming the third electrode 266 is a process in which a large amount of chemicals such as ink jet is not used, the buffer layer 286 is unnecessary.

The display device is not limited to an organic electroluminescence display device, but a display device in which each pixel includes a light-emitting element such as a quantum-dot light emitting diode (QLED) or a liquid crystal display device may be used. The touch sensor is not limited to the mutual capacitance scheme, but may be a self-capacitance scheme.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A touch sensor comprising:
   first electrodes;
   second electrodes, the first electrodes and the second electrodes being in a same layer;
   third electrodes above the first electrodes and the second electrodes;
   an inorganic insulation layer below the first electrodes, the second electrodes, and the third electrodes; and
   a buffer layer between the first electrodes and the third electrodes, wherein
   two of the first electrodes are connected via a first connection part in a first direction, and
   two of the second electrodes are connected via a second connection part in a second direction differing from the first direction.

2. The touch sensor according to claim 1, wherein the first electrodes and the second electrodes are disposed on the inorganic insulation layer.

3. The touch sensor according to claim 1, wherein the first electrodes are disposed without overlapping the second electrodes in a plan view.

4. The touch sensor according to claim 1, further comprising:
   an insulation layer between the first electrode and the buffer layer.

5. The touch sensor according to claim 4, wherein the insulation layer is disposed in a space between an edge of the first electrode and an edge of the second electrode being opposite to the edge of the first electrode.

6. The touch sensor according to claim 4, wherein the insulation layer is flexible.

7. The touch sensor according to claim 4, wherein the insulation layer includes soft material.

8. The touch sensor according to claim 1, wherein the buffer layer includes SiN.

9. The touch sensor according to claim 1, wherein
   the third electrodes are on and in contact with the buffer layer,
   the buffer layer overlaps the first electrodes and the second electrodes in a plan view, and
   each of the third electrodes overlaps a corresponding one of the first electrodes and does not overlap the second electrodes in the plan view.

10. A display device comprising:
    a pixel electrode;
    a light-emitting element above the pixel electrode;
    a counter electrode above the light-emitting element;
    an inorganic insulation layer above the counter electrode;
    first electrodes above the inorganic insulation layer;
    second electrodes above the inorganic insulation layer, the first electrodes and the second electrodes being in a same layer;
    third electrodes above the inorganic insulation layer, the first electrodes, and the second electrodes; and
    a buffer layer between the first electrodes and the third electrodes, wherein
    two of the first electrodes are connected via a first connection part in a first direction, and
    two of the second electrodes are connected via a second connection part in a second direction differing from the first direction.

11. The display device according to claim 10, wherein the first electrodes and the second electrodes are disposed on the inorganic insulation layer.

12. The display device according to claim 10, wherein the first electrodes are disposed without overlapping the second electrodes in a plan view.

13. The display device according to claim 10, further comprising:
    a first insulation layer between the first electrode and the buffer layer.

14. The display device according to claim 13, further comprising:
    a second insulation layer above the pixel electrode, wherein
    the second insulation layer covers a peripheral portion of the pixel electrode,
    the first electrode overlaps the second insulation layer in a plan view.

15. The display device according to claim 14, further comprising:
    a second insulation layer above the pixel electrode, wherein
    the second insulation layer covers a peripheral portion of the pixel electrode,
    one of the third electrodes overlap the second insulation layer in a plan view.

16. The display device according to claim 10, wherein
the first insulation layer is disposed in a space between an edge of the first electrode and an edge of the second electrode being opposite to the edge of the first electrode.

17. The display device according to claim 13, wherein
the first insulation layer is flexible.

18. The display device according to claim 13, wherein
the first insulation layer includes soft material.

19. The display device according to claim 10, wherein
the buffer layer includes SiN.

20. The display device according to claim 10, wherein
the third electrodes are on and in contact with the buffer layer, the buffer layer overlaps the first electrodes and the second electrodes in a plan view, and each of the third electrodes overlaps a corresponding one of the first electrodes and does not overlap the second electrodes in the plan view.

* * * * *